(12) United States Patent
Ho et al.

(10) Patent No.: US 9,537,497 B2
(45) Date of Patent: Jan. 3, 2017

(54) CONTINUOUS TIME DELTA SIGMA MODULATOR, ANALOG TO DIGITAL CONVERTER AND ASSOCIATED COMPENSATION METHOD

(71) Applicant: MEDIATEK INC., Hsin-Chu (TW)

(72) Inventors: Chen-Yen Ho, New Taipei (TW); Yu-Hsin Lin, Taipei (TW); Tze-Chien Wang, Hsinchu County (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 15/044,125

(22) Filed: Feb. 16, 2016

(65) Prior Publication Data
US 2016/0336946 A1    Nov. 17, 2016

Related U.S. Application Data

(60) Provisional application No. 62/161,608, filed on May 14, 2015.

(51) Int. Cl.
| | |
|---|---|
| *H03M 1/00* | (2006.01) |
| *H03M 1/06* | (2006.01) |
| *H03M 3/00* | (2006.01) |

(52) U.S. Cl.
CPC .............. *H03M 1/06* (2013.01); *H03M 3/422* (2013.01); *H03M 3/464* (2013.01)

(58) Field of Classification Search
CPC ...... H03M 3/438; H03M 3/424; H03M 3/464; H03M 3/322; H03M 3/454; H03M 3/452; H03M 3/00; H03M 3/12; H03M 3/43; H03M 3/45; H03M 3/448; H03M 3/365; H03M 3/422; H03M 1/06

(Continued)

(56) References Cited

U.S. PATENT DOCUMENTS

| | | | |
|---|---|---|---|
| 8,643,524 B1 * | 2/2014 | Zanbaghi | H03M 3/322 341/143 |
| 2003/0227401 A1 * | 12/2003 | Yang | H03M 3/368 341/143 |

(Continued)

OTHER PUBLICATIONS

Tsai, "A 64-fJ/Conv.-Step Continuous-Time sigma-delta Modulator in 40-nm CMOS Using Asynchronous SAR Quantizer and Digital delta-sigma Truncator", IEEE Journal of Solid-State Circuits, vol. 48, No. 11, Nov. 2013.

(Continued)

*Primary Examiner* — Lam T Mai
(74) *Attorney, Agent, or Firm* — Winston Hsu; Scott Margo

(57) ABSTRACT

A continuous time delta sigma modulator includes a summing circuit, a loop filter, an extraction circuit, a quantizer and a digital to analog converter. The summing circuit is arranged for subtracting a feedback signal by an input signal to generate a residual signal. The loop filter includes a plurality of amplifying stages connected in series and is arranged to receive the residual signal to generate a filtered residual signal. The extraction circuit is arranged for extracting a current from one of the amplifying stages and forwarding the extracted current to a following one of the amplifying stages. The quantizer is arranged for generating a digital output signal according to the filtered residual signal. The digital to analog converter is arranged for performing a digital to analog converting operation upon a signal derived from the digital output signal to generate the feedback signal to the summing circuit.

46 Claims, 6 Drawing Sheets

(58) Field of Classification Search
USPC .......................................................... 341/143
See application file for complete search history.

(56) References Cited

U.S. PATENT DOCUMENTS

| | | | | |
|---|---|---|---|---|
| 2007/0018866 | A1* | 1/2007 | Melanson | H03M 7/3035 341/143 |
| 2007/0247341 | A1* | 10/2007 | Liu | H03M 3/32 341/143 |
| 2008/0074303 | A1* | 3/2008 | Rueger | H03M 3/39 341/143 |
| 2009/0278721 | A1* | 11/2009 | Hamashita | H03M 3/412 341/143 |
| 2009/0309774 | A1* | 12/2009 | Hamashita | H03M 3/42 341/143 |
| 2012/0319881 | A1* | 12/2012 | Huang | H03M 3/438 341/143 |
| 2013/0187803 | A1* | 7/2013 | Kaald | H03M 3/37 341/143 |
| 2014/0113575 | A1* | 4/2014 | Mitani | H03M 3/44 455/78 |
| 2014/0159930 | A1* | 6/2014 | Ho | H03M 3/32 341/143 |
| 2014/0167995 | A1* | 6/2014 | Tiew | H03M 3/30 341/143 |

OTHER PUBLICATIONS

Lo, "A 75.1dB SNDR 840MS/s CT delta-sigma Modulator with 30MHz Bandwidth and 46.4fJ/conv FOM in 55nm CMOS", Symp. on VLSI Circuits Dig. Tech. Papers, pp. 60-61, Jun. 2013.

Ho, "A 4.5mW CT Self-Coupled delta-sigma Modulator with 2.2MHz BW and 90.4dB SNDR Using Residual ELD Compensation", ISSCC Dig. Tech. Papers, pp. 274-275 and Figure 15.2.7, Feb. 2015.

* cited by examiner

CONTINUOUS TIME DELTA SIGMA MODULATOR, ANALOG TO DIGITAL CONVERTER AND ASSOCIATED COMPENSATION METHOD

CROSS REFERENCE TO RELATED APPLICATIONS

This application claims the priority of U.S. Provisional Application No. 62/161,608, filed on May 14, 2015, which is included herein by reference in its entirety.

BACKGROUND

A high resolution continuous time delta-sigma modulator serves as a power efficient candidate with a signal bandwidth ranging from audio band to several megahertz. However, the higher frequency input signal of the continuous time delta-sigma modulator may cause difficult excess loop delay compensation. To solve the excess loop delay compensation problem caused by the high frequency input signal, an additional circuit such as a digital to analog converter (DAC) is arranged to process a feedback signal from an output of the quantizer to an output of the pre-stage loop filter, and therefore there are more than one DACs configured in the excess loop of the continuous time delta-sigma modulator. This additional circuit such as DAC increases the power consumption and provides a large parasitic capacitance to the loop filter.

SUMMARY

It is therefore an objective of the present invention to provide a continuous time delta-sigma modulator, which feed-forwards a current extracted from an amplifying stage to a following amplifying stage of a loop filter, to solve the above-mentioned problem.

According to one embodiment of the present invention, a continuous time delta sigma modulator comprises a first summing circuit, a loop filter, an extraction circuit, a quantizer and a digital to analog converter. The first summing circuit is arranged for subtracting a feedback signal by an input signal to generate a residual signal. The loop filter comprises a plurality of amplifying stages connected in series and is arranged to receive the residual signal to generate a filtered residual signal. The extraction circuit is coupled to the loop filter, and is arranged for extracting a current from one of the amplifying stages and forwarding the extracted current to a following one of the amplifying stages. The quantizer is coupled to the loop filter, and is arranged for generating a digital output according to the filtered residual signal. The digital to analog converter is coupled to the quantizer and the first summing circuit, and is arranged for performing a digital to analog converting operation upon a signal derived from the digital output to generate the feedback signal to the first summing circuit.

According to another embodiment of the present invention, an analog to digital converter comprises a first summing circuit, a loop filter, an extraction circuit, a quantizer and a digital to analog converter. The first summing circuit is arranged for subtracting a feedback signal by an input signal to generate a residual signal. The loop filter comprises a plurality of amplifying stages connected in series and is arranged to receive the residual signal to generate a filtered residual signal. The extraction circuit is coupled to the loop filter, and is arranged for extracting a current from one of the amplifying stages and forwarding the extracted current to a following one of the amplifying stages. The quantizer is coupled to the loop filter, and is arranged for generating a digital output according to the filtered residual signal. The digital to analog converter is coupled to the quantizer and the first summing circuit, and is arranged for performing a digital to analog converting operation upon a signal derived from the digital output to generate the feedback signal to the first summing circuit.

According to another embodiment of the present invention, a compensation method of an analog to digital converter comprises: subtracting a feedback signal by an input signal to generate a residual signal; providing a loop filter comprising a plurality of amplifying stages connected in series and arranged to receive the residual signal to generate a filtered residual signal; extracting a current from one of the amplifying stages and forwarding the extracted current to a following one of the amplifying stages to compensate a loop delay of the analog to digital converter; generating a digital output according to the filtered residual signal; and performing an digital to analog converting operation upon a signal derived from the digital output to generate the feedback signal.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims to refer to particular system components. As one skilled in the art will appreciate, manufacturers may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . " The terms "couple" and "couples" are intended to mean either an indirect or a direct electrical connection. Thus, if a first device couples to a second device, that connection may be through a direct electrical connection, or through an indirect electrical connection via other devices and connections.

Figure 1:
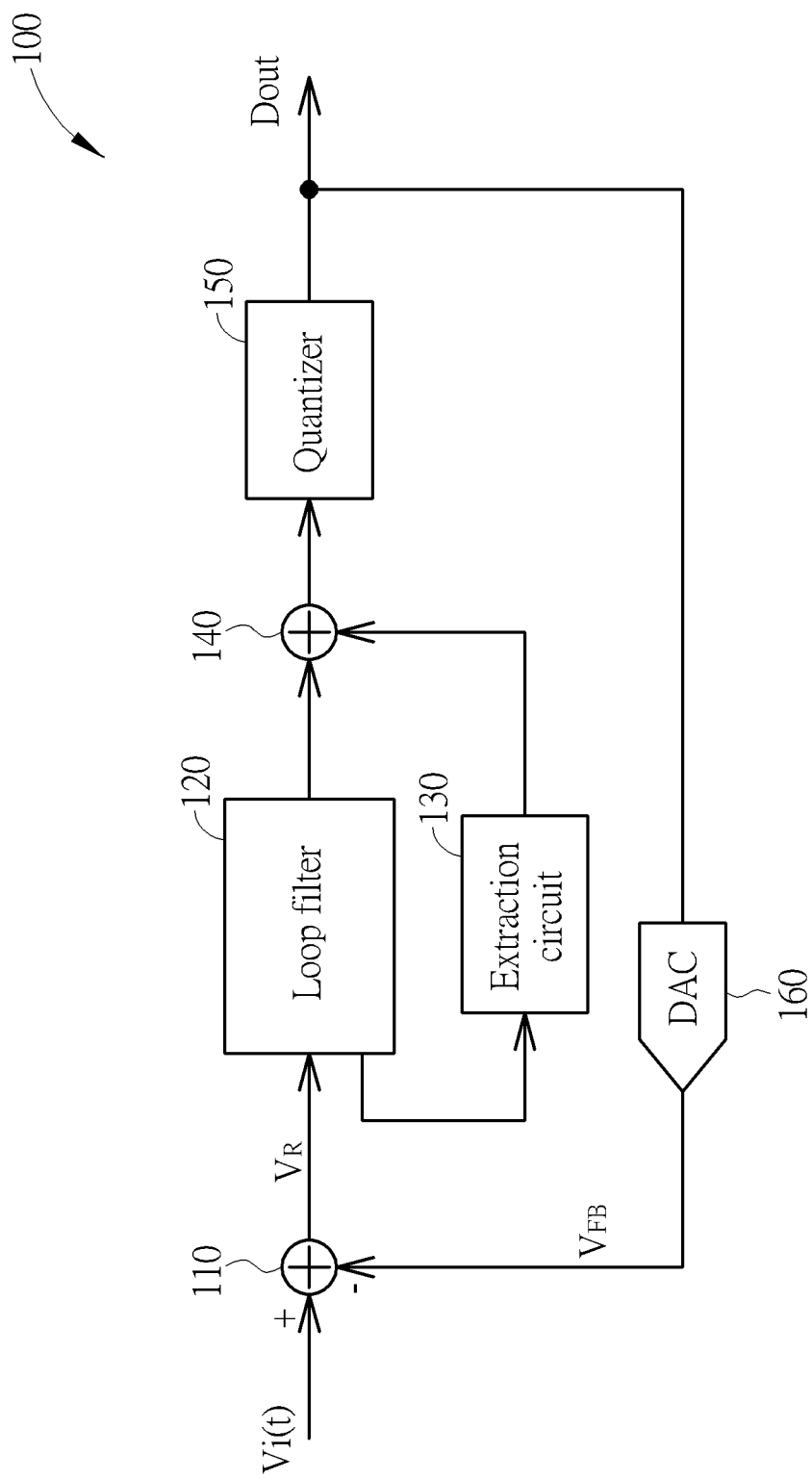
FIG. 1 is a diagram illustrating an ADC according to one embodiment of the present invention.

Please refer to FIG. 1, which is a diagram illustrating an analog to digital converter (ADC) 100 according to one embodiment of the present invention, where in this embodiment, the ADC 100 is a continuous time delta sigma modulator type ADC. As shown in FIG. 1, the ADC 100 comprises a first summing circuit 110, a loop filter 120, an extraction circuit 130, a second summing circuit 140, a quantizer 150 and a DAC 160. In this embodiment, the loop filter 120 comprises a plurality of amplifying stages connected in series, and each amplifying stage may be implemented by an integrator.

In the operations of the ADC 100, the first summing circuit 110 receives an input signal Vi(t) and a feedback signal $V_{FB}$, and calculates a difference by subtracting the feedback signal $V_{FB}$ by the input signal Vi(t) to generate a residual signal $V_R$. Then, the loop filter 120 filters the residual signal $V_R$. Meanwhile, the extraction circuit 130 extracts a current from one of the amplifying stages and forwards the extracted current to a following one of the amplifying stages, where in this embodiment the extracted current is forwarded to an output node of the last amplifying stage. The second summing circuit 140 combines the extracted current and an output current of the loop filter to generate a filtered residual signal. The quantizer 150 generates a digital output Dout according to the filtered residual signal. Then, the DAC 160 performs a digital to analog converting operation upon a signal derived from the filtered residual signal to generate the feedback signal $V_{FB}$ to the first summing circuit 110.

Figure 2:
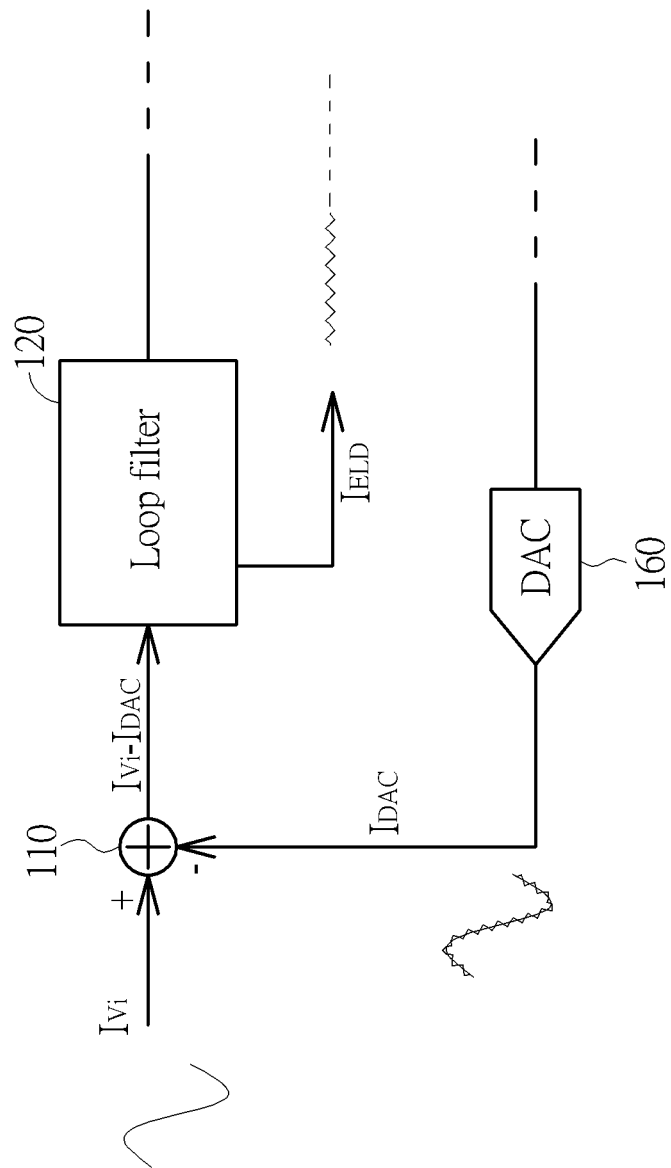
FIG. 2 shows the currents provided by the input signal, DAC and extraction circuit.

In this embodiment, the compensation of the excess loop delay of the ADC 100 uses a current-mode implementation. Refer to FIG. 2, a current $I_{DAC}$ provided by the DAC 160 is similar to a current $I_{Vi}$ provided by the input signal Vi(t), but the current $I_{DAC}$ is with quantization errors (noise). Therefore, the residual signal $V_R$ (having the current $I_{Vi}-I_{DAC}$) outputted by the first summing circuit 110 can be regarded as quantization errors of the ADC 100. Then, the current $I_{ELD}$ extracted from the one of the amplifying stages of the loop filter 120 (i.e. extracted from the residual signal $V_R$) is forwarded to the last amplifying stage to compensate a constant coefficient of the loop filter 120 to compensate the excess loop delay of the ADC 100. By using the residual signal $V_R$ to compensate the excess loop delay, the constant coefficient of the loop filter 120 can be compensated, and the compensation method is merely involved with the feedback signal $V_{FB}$ provided by the DAC 160, and is not involved with any other DAC. Therefore, the power consumption and the chip area can be improved.

Figure 3:
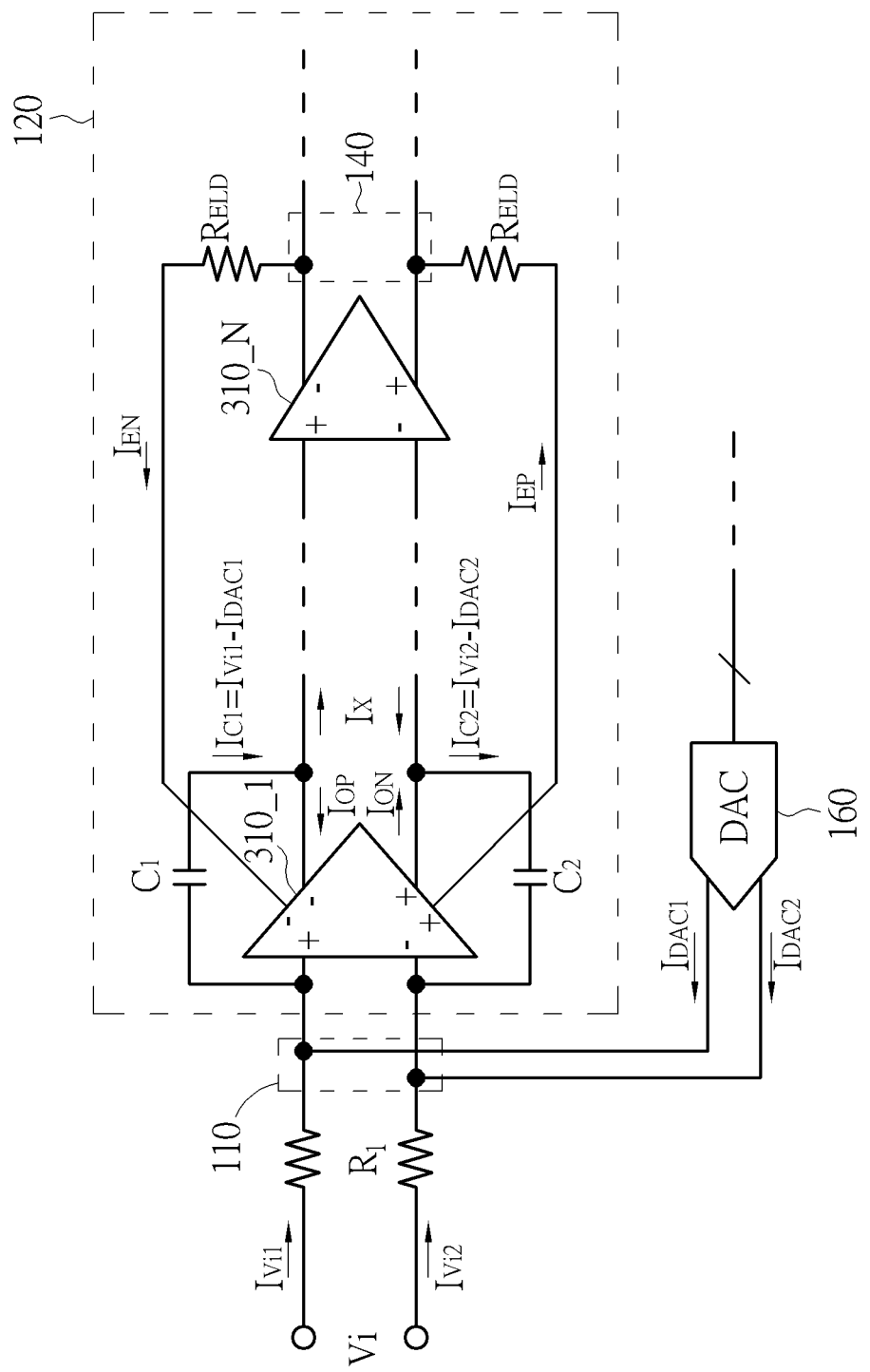
FIG. 3 is a diagram illustrating amplifying stages of the loop filter and the flow of the extracted current according to one embodiment of the present invention.

Refer to FIG. 3, which is a diagram illustrating amplifying stages of the loop filter 120 and the flow of the extracted current according to one embodiment of the present invention. As shown in FIG. 3, the ADC 100 is of a differential structure, and the loop filter 120 comprises a plurality of amplifying stages, where each amplifying stage comprises an operational amplifier such as 310_1-310_N. In FIG. 3, the first amplifying stage is an integrator comprising the operational amplifier 310_1 and two capacitors C1 and C2, the current flowing through the capacitor C1 is equal to ($I_{vi1}-I_{DAC1}$), the current flowing through the capacitor C2 is equal to ($I_{vi2}-I_{DAC2}$), and the differential output signal of the operational amplifier 310_1 comprises $I_{op}=I_{C1}-Ix$ and $I_{ON}=I_{C2}-Ix$, where $I_{vi1}$ and $I_{vi2}$ are differential input currents, and $I_{DAC1}$ and $I_{DAC2}$ are differential feedback currents. The extraction circuit 130 (not shown in FIG. 3) extracts the current $I_{EN}$ and $I_{EP}$ from the output currents IOP and ION of the operational amplifier 310_1, respectively, and the extraction circuit 130 forwards the extracted current $I_{EN}$ and $I_{EP}$ to the output nodes of the operational amplifier 310_N via compensation resistors $R_{ELD}$. In addition, in one embodiment, the extraction circuit 130 mirrors the output currents $I_{OP}$ and $I_{ON}$ with a ratio to generate the extracted current $I_{EN}$ and $I_{EP}$.

Figure 4:
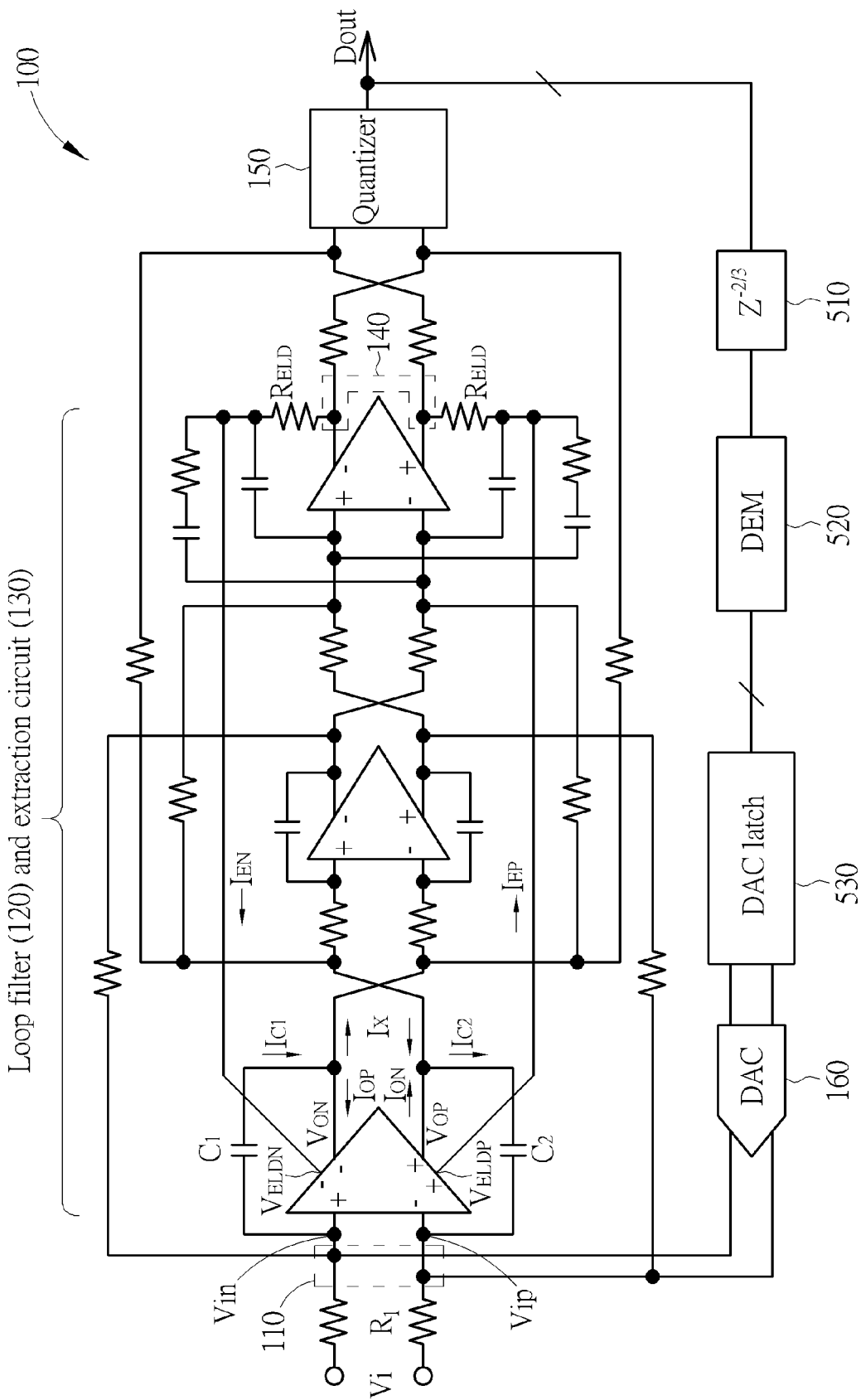
FIG. 4 shows a detailed structure of the ADC shown in FIG. 1 according to one embodiment of the present invention.

FIG. 4 shows a detailed structure of the ADC 100 according to one embodiment of the present invention. As shown in FIG. 4, the loop filter 120 comprises three amplifying stages, and each amplifying stage is implemented by an integrator, and the ADC 100 further comprises a phase adjusting circuit 510, a Dynamic Element Matching (DEM) circuit 520 and a DAC latch 530. Similar to FIG. 3, FIG. 4 shows that the current $I_{EN}$ and $I_{EP}$ are extracted from the output currents $I_{OP}$ and $I_{ON}$ of the first amplifying stage, and forwards the extracted current $I_{EN}$ and $I_{EP}$ to the output nodes of the last amplifying stage (i.e. forwards the extracted current $I_{EN}$ and $I_{EP}$ to the second summing circuit 140).

Figure 5:
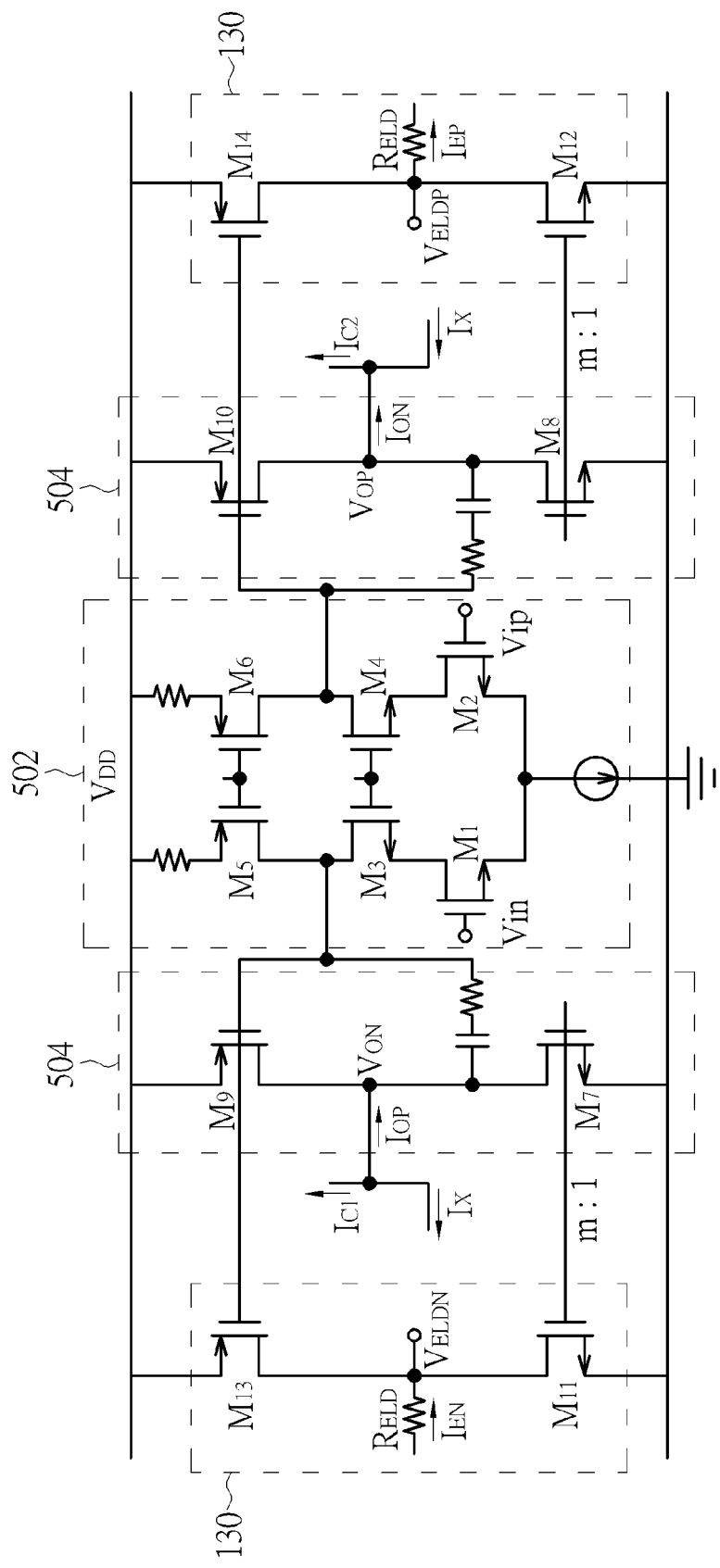
FIG. 5 shows a detailed structure of the extraction circuit and the first amplifying stage of the loop filter according to one embodiment of the present invention.

FIG. 5 shows a detailed structure of the extraction circuit 130 and the first amplifying stage of the loop filter 120 according to one embodiment of the present invention. As shown in FIG. 5, transistors M1-M6 form an operational amplifier 502 of the first amplifying stage of the loop filter 120, transistors M7-M10 form an output stage 504 of the first amplifying stage, and transistors M11-M14 and the compensation resistors $R_{ELD}$ form the extraction circuit 130. In the operations of the circuits shown in FIG. 5, the operational amplifier 502 receives the residual signals Vin and Vip (i.e. "$V_R$" shown in FIG. 1) and generates output voltages $V_{ON}$, $V_{OP}$ and the output currents $I_{Op}$, $I_{ON}$ at the output stage 504. Then, the extraction circuit 130 mirrors the current at the output stage with a ratio (1/m) to generate the extraction currents $I_{EN}$ and $I_{EP}$. It is noted that FIG. 4 and FIG. 5 show some elements (e.g. capacitors and resistors and so on) without the reference numbers, these elements are related to the general functions or stabilization purposes of the loop filter 120, and further descriptive details of the components are omitted here.

The above-mentioned embodiment shows that the extraction circuit 130 extracts the current from the first amplifying stage to the output node of the last amplifying stage of the loop filter 120. The embodiment shows an exemplary implementation rather than a limitation to the present invention. In other embodiments, the extraction circuit 130 can extract the current from any one of the amplifying stage of the loop filter 120 to the following amplifying stage to compensate the excess loop delay of the ADC 100. In another embodiment, the extraction circuit 130 may extract a plurality of current from two or more amplifying stages (e.g. from the first, second and third amplifying stages), and forwards three extracted currents to the following amplifying stage (e.g. the last amplifying stage). These alternative designs shall fall within the scope of the present invention.

Figure 6:
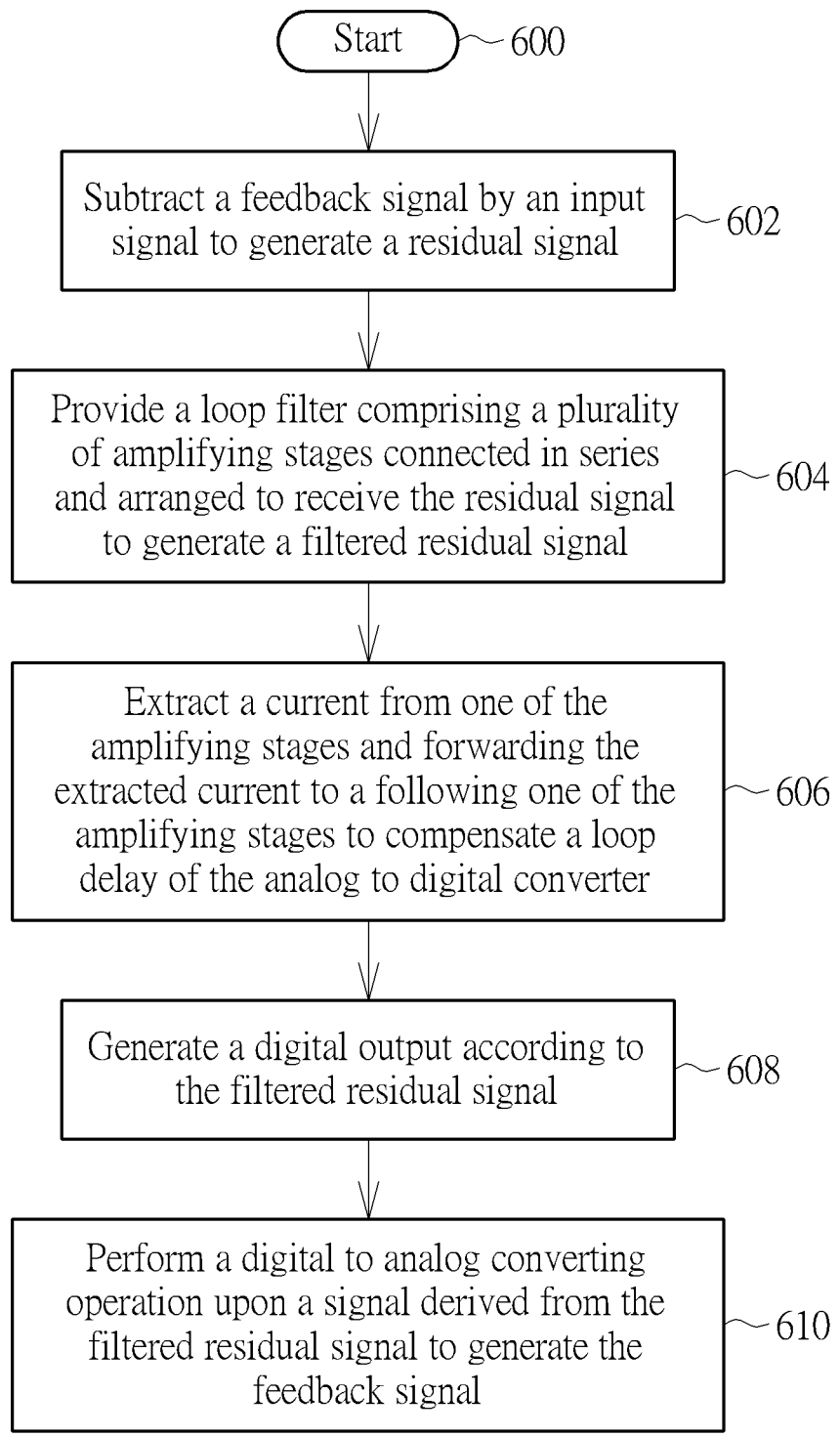
FIG. 6 is a flowchart of a compensation method of an ADC according to one embodiment of the present invention.

FIG. 6 is a flowchart of a compensation method of an ADC according to one embodiment of the present invention. Refer to FIGS. 1-6 together, the flow is as follows:

Step 600: the flow starts.

Step 602: subtract a feedback signal by an input signal to generate a residual signal.

Step 604: provide a loop filter comprising a plurality of amplifying stages connected in series and arranged to receive the residual signal to generate a filtered residual signal.

Step 606: extract a current from one of the amplifying stages and forwarding the extracted current to a following one of the amplifying stages to compensate a loop delay of the analog to digital converter.

Step 608: generate a digital output according to the filtered residual signal.

Step 610: perform a digital to analog converting operation upon a signal derived from the filtered residual signal to generate the feedback signal.

Briefly summarized, in the continuous time delta-sigma modulator of the present invention, the loop filter receives the residual signal (i.e. the difference between the input signal and the feedback signal), and a current extracted from one amplifying stage of the loop filter is forwarded to the following amplifying stage to compensate the excess loop delay. In the embodiment of the present invention, only one DAC is required, and the excess loop delay compensation is not involved with any other DAC. Therefore, the power consumption and the chip area can be improved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A continuous time delta sigma modulator, comprising:
    a first summing circuit, for subtracting a feedback signal by an input signal to generate a residual signal;
    a loop filter comprising a plurality of amplifying stages connected in series and arranged to receive the residual signal to generate a filtered residual signal;
    an extraction circuit, coupled to the loop filter, for extracting a current from one of the amplifying stages and forwarding the extracted current to a following one of the amplifying stages;
    a quantizer, coupled to the loop filter, for generating a digital output signal according to the filtered residual signal; and
    a digital to analog converter, coupled to the quantizer and the first summing circuit, for performing a digital to analog converting operation upon a signal derived from the digital output signal to generate the feedback signal to the first summing circuit;
    wherein the extraction circuit mirrors an output current of the one of the amplifying stages to generate the extracted current, and forwards the extracted current to the following one of the amplifying stages.

2. The continuous time delta sigma modulator of claim 1, wherein the extraction circuit forwards the extracted current to an output node of the following one of the amplifying stages.

3. The continuous time delta sigma modulator of claim 1, wherein the extraction circuit mirrors the current from a first one of the amplifying stages and forwards the extracted current to a last one of the amplifying stages.

4. The continuous time delta sigma modulator of claim 1, wherein the extracted current and an output current of a last amplifying stage of the loop filter are combined to generate the filtered residual signal.

5. The continuous time delta sigma modulator of claim 1, wherein the extracted current forwarded to the following one of the amplifying stages is used to compensate a coefficient of the following one of the amplifying stages; and compensations of the amplifying stages are not involved with any other digital to analog converter.

6. The continuous time delta sigma modulator of claim 1, wherein the loop filter further comprises a compensation resistor coupled to an output node of the following one of the amplifying stages, and the extraction circuit directly forwards the extracted current to the following one of the amplifying stages via the compensation resistor.

7. The continuous time delta sigma modulator of claim 1, wherein the extraction circuit extracts currents from two or more amplifying stages, and forwards the currents to the following one of the amplifying stages.

8. A compensation method of an analog to digital converter, comprising:
    subtracting a feedback signal by an input signal to generate a residual signal;
    providing a loop filter comprising residual a plurality of amplifying stages connected in series and arranged to receive the residual signal to generate a filtered residual signal;
    extracting a current from one of the amplifying stages and forwarding the extracted current to a following one of the amplifying stages to compensate a loop delay of the analog to digital converter;
    generating a digital output signal according to the filtered residual signal; and
    performing a digital to analog converting operation upon a signal derived from the digital output to generate the feedback signal;
    wherein the step of extracting the current from the output current of the one of the amplifying stages and forwarding the extracted current to the following one of the amplifying stages comprises:
        mirroring the output current of the one of the amplifying stages to generate the extracted current, and forwarding the extracted current to the following one of the amplifying stages.

9. The compensation method of claim 8, wherein the step of extracting the current from the output current of the one of the amplifying stages and forwarding the extracted current to the following one of the amplifying stages comprises:
    forwarding the extracted current to an output node of the following one of the amplifying stages.

10. The compensation method of claim 8, wherein the step of extracting the current from the one of the amplifying stages and forwarding the extracted current to the following one of the amplifying stages comprises:
    mirroring the current from a first one of the amplifying stages and forwarding the extracted current to a last one of the amplifying stages.

11. The compensation method of claim 8, further comprising:
    combining the extracted current and an output current of a last amplifying stage of the loop filter to generate the filtered residual signal.

12. The compensation method of claim 8, wherein the feedback signal is generated by a digital to analog converter, and compensations of the amplifying stages are not involved with any other digital to analog converter.

13. The compensation method of claim 8, wherein the loop filter further comprises a compensation resistor coupled to an output node of the following one of the amplifying stages, and the step of extracting the current from the one of the amplifying stages and forwarding the extracted current to the following one of the amplifying stages comprises:
    directly forwarding the extracted current to the following one of the amplifying stages via the compensation resistor.

14. The compensation method of claim 8, wherein the step of extracting the current from the one of the amplifying stages and forwarding the extracted current to the following one of the amplifying stages comprises:
    extracting currents from two or more amplifying stages, and forwarding the currents to the following one of the amplifying stages.

15. A continuous time delta sigma modulator, comprising:
    a first summing circuit, for subtracting a feedback signal by an input signal to generate a residual signal;

a loop filter comprising a plurality of amplifying stages connected in series and arranged to receive the residual signal to generate a filtered residual signal;

an extraction circuit, coupled to the loop filter, for extracting a current from one of the amplifying stages and forwarding the extracted current to a following one of the amplifying stages;

a quantizer, coupled to the loop filter, for generating a digital output signal according to the filtered residual signal; and a digital to analog converter, coupled to the quantizer and the first summing circuit, for performing a digital to analog converting operation upon a signal derived from the digital output signal to generate the feedback signal to the first summing circuit;

wherein the extracted current forwarded to the following one of the amplifying stages is used to compensate a coefficient of the following one of the amplifying stages; and compensations of the amplifying stages are not involved with any other digital to analog converter.

16. The continuous time delta sigma modulator of claim 15, wherein the extraction circuit extracts the current from an output current of the one of the amplifying stages and forwards the extracted current to the following one of the amplifying stages.

17. The continuous time delta sigma modulator of claim 16, wherein the extraction circuit mirrors the output current of the one of the amplifying stages to generate the extracted current, and forwards the extracted current to the following one of the amplifying stages.

18. The continuous time delta sigma modulator of claim 16, wherein the extraction circuit extracts the current from the output current of the one of the amplifying stages and forwards the extracted current to an output node of the following one of the amplifying stages.

19. The continuous time delta sigma modulator of claim 15, wherein the extraction circuit extracts the current from a first one of the amplifying stages and forwards the extracted current to a last one of the amplifying stages.

20. The continuous time delta sigma modulator of claim 15, wherein the extracted current and an output current of a last amplifying stage of the loop filter are combined to generate the filtered residual signal.

21. The continuous time delta sigma modulator of claim 15, wherein the loop filter further comprises a compensation resistor coupled to an output node of the following one of the amplifying stages, and the extraction circuit directly forwards the extracted current to the following one of the amplifying stages via the compensation resistor.

22. The continuous time delta sigma modulator of claim 15, wherein the extraction circuit extracts currents from two or more amplifying stages, and forwards the currents to the following one of the amplifying stages.

23. A continuous time delta sigma modulator, comprising:
a first summing circuit, for subtracting a feedback signal by an input signal to generate a residual signal;
a loop filter comprising a plurality of amplifying stages connected in series and arranged to receive the residual signal to generate a filtered residual signal;
an extraction circuit, coupled to the loop filter, for extracting a current from one of the amplifying stages and forwarding the extracted current to a following one of the amplifying stages;
a quantizer, coupled to the loop filter, for generating a digital output signal according to the filtered residual signal; and
a digital to analog converter, coupled to the quantizer and the first summing circuit, for performing a digital to analog converting operation upon a signal derived from the digital output signal to generate the feedback signal to the first summing circuit;
wherein the loop filter further comprises a compensation resistor coupled to an output node of the following one of the amplifying stages, and the extraction circuit directly forwards the extracted current to the following one of the amplifying stages via the compensation resistor.

24. The continuous time delta sigma modulator of claim 23, wherein the extraction circuit extracts the current from an output current of the one of the amplifying stages and forwards the extracted current to the following one of the amplifying stages.

25. The continuous time delta sigma modulator of claim 24, wherein the extraction circuit mirrors the output current of the one of the amplifying stages to generate the extracted current, and forwards the extracted current to the following one of the amplifying stages.

26. The continuous time delta sigma modulator of claim 24, wherein the extraction circuit extracts the current from the output current of the one of the amplifying stages and forwards the extracted current to an output node of the following one of the amplifying stages.

27. The continuous time delta sigma modulator of claim 23, wherein the extraction circuit extracts the current from a first one of the amplifying stages and forwards the extracted current to a last one of the amplifying stages.

28. The continuous time delta sigma modulator of claim 23, wherein the extracted current and an output current of a last amplifying stage of the loop filter are combined to generate the filtered residual signal.

29. The continuous time delta sigma modulator of claim 23, wherein the extracted current forwarded to the following one of the amplifying stages is used to compensate a coefficient of the following one of the amplifying stages; and compensations of the amplifying stages are not involved with any other digital to analog converter.

30. The continuous time delta sigma modulator of claim 23, wherein the extraction circuit extracts currents from two or more amplifying stages, and forwards the currents to the following one of the amplifying stages.

31. A compensation method of an analog to digital converter, comprising:
subtracting a feedback signal by an input signal to generate a residual signal;
providing a loop filter comprising residual a plurality of amplifying stages connected in series and arranged to receive the residual signal to generate a filtered residual signal;
extracting a current from one of the amplifying stages and forwarding the extracted current to a following one of the amplifying stages to compensate a loop delay of the analog to digital converter;
generating a digital output signal according to the filtered residual signal; and
performing a digital to analog converting operation upon a signal derived from the digital output to generate the feedback signal;
wherein the feedback signal is generated by a digital to analog converter, and compensations of the amplifying stages are not involved with any other digital to analog converter.

32. The compensation method of claim 31, wherein the step of extracting the current from the one of the amplifying stages and forwarding the extracted current to the following one of the amplifying stages comprises:

extracting the current from an output current of the one of the amplifying stages and forwarding the extracted current to the following one of the amplifying stages.

33. The compensation method of claim 32, wherein the step of extracting the current from the output current of the one of the amplifying stages and forwarding the extracted current to the following one of the amplifying stages comprises:

mirroring the output current of the one of the amplifying stages to generate the extracted current, and forwarding the extracted current to the following one of the amplifying stages.

34. The compensation method of claim 32, wherein the step of extracting the current from the output current of the one of the amplifying stages and forwarding the extracted current to the following one of the amplifying stages comprises:

extracting the current from the output current of the one of the amplifying stages and forwarding the extracted current to an output node of the following one of the amplifying stages.

35. The compensation method of claim 31, wherein the step of extracting the current from the one of the amplifying stages and forwarding the extracted current to the following one of the amplifying stages comprises:

extracting the current from a first one of the amplifying stages and forwarding the extracted current to a last one of the amplifying stages.

36. The compensation method of claim 31, further comprising:

combining the extracted current and an output current of a last amplifying stage of the loop filter to generate the filtered residual signal.

37. The compensation method of claim 31, wherein the loop filter further comprises a compensation resistor coupled to an output node of the following one of the amplifying stages, and the step of extracting the current from the one of the amplifying stages and forwarding the extracted current to the following one of the amplifying stages comprises:

directly forwarding the extracted current to the following one of the amplifying stages via the compensation resistor.

38. The compensation method of claim 31, wherein the step of extracting the current from the one of the amplifying stages and forwarding the extracted current to the following one of the amplifying stages comprises:

extracting currents from two or more amplifying stages, and forwarding the currents to the following one of the amplifying stages.

39. A compensation method of an analog to digital converter, comprising:

subtracting a feedback signal by an input signal to generate a residual signal;

providing a loop filter comprising residual a plurality of amplifying stages connected in series and arranged to receive the residual signal to generate a filtered residual signal;

extracting a current from one of the amplifying stages and forwarding the extracted current to a following one of the amplifying stages to compensate a loop delay of the analog to digital converter;

generating a digital output signal according to the filtered residual signal; and performing a digital to analog converting operation upon a signal derived from the digital output to generate the feedback signal;

wherein the loop filter further comprises a compensation resistor coupled to an output node of the following one of the amplifying stages, and the step of extracting the current from the one of the amplifying stages and forwarding the extracted current to the following one of the amplifying stages comprises:

directly forwarding the extracted current to the following one of the amplifying stages via the compensation resistor.

40. The compensation method of claim 39, wherein the step of extracting the current from the one of the amplifying stages and forwarding the extracted current to the following one of the amplifying stages comprises:

extracting the current from an output current of the one of the amplifying stages and forwarding the extracted current to the following one of the amplifying stages.

41. The compensation method of claim 40, wherein the step of extracting the current from the output current of the one of the amplifying stages and forwarding the extracted current to the following one of the amplifying stages comprises:

mirroring the output current of the one of the amplifying stages to generate the extracted current, and forwarding the extracted current to the following one of the amplifying stages.

42. The compensation method of claim 40, wherein the step of extracting the current from the output current of the one of the amplifying stages and forwarding the extracted current to the following one of the amplifying stages comprises:

extracting the current from the output current of the one of the amplifying stages and forwarding the extracted current to an output node of the following one of the amplifying stages.

43. The compensation method of claim 39, wherein the step of extracting the current from the one of the amplifying stages and forwarding the extracted current to the following one of the amplifying stages comprises:

extracting the current from a first one of the amplifying stages and forwarding the extracted current to a last one of the amplifying stages.

44. The compensation method of claim 39, further comprising:

combining the extracted current and an output current of a last amplifying stage of the loop filter to generate the filtered residual signal.

45. The compensation method of claim 39, wherein the feedback signal is generated by a digital to analog converter, and compensations of the amplifying stages are not involved with any other digital to analog converter.

46. The compensation method of claim 39, wherein the step of extracting the current from the one of the amplifying stages and forwarding the extracted current to the following one of the amplifying stages comprises:

extracting currents from two or more amplifying stages, and forwarding the currents to the following one of the amplifying stages.

* * * * *